(12) United States Patent
Nakasuji

(10) Patent No.: US 6,541,785 B1
(45) Date of Patent: Apr. 1, 2003

(54) ELECTRON-BEAM SOURCES AND ELECTRON-BEAM MICROLITHOGRAPHY APPARATUS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 69 days.

(21) Appl. No.: 09/596,707

(22) Filed: Jun. 20, 2000

(30) Foreign Application Priority Data

Jun. 24, 1999 (JP) ............................................. 11-178013

(51) Int. Cl.⁷ .............................. H01J 1/14; H01J 37/00
(52) U.S. Cl. ................................ 250/493.1; 250/492.1; 250/492.3; 250/396 R; 313/346 R
(58) Field of Search .................... 250/492.22, 492.2, 250/492.3, 492.1, 493.1; 313/346 R, 310

(56) References Cited

U.S. PATENT DOCUMENTS

| | | | | |
|---|---|---|---|---|
| 4,528,474 A | * | 7/1985 | Kim ........................ 313/346 R |
| 4,551,606 A | * | 11/1985 | Inoue ......................... 219/121 |
| 5,532,496 A | * | 7/1996 | Gaston .................. 250/492.22 |
| 6,218,676 B1 | * | 4/2001 | Nakasuji .................. 250/492.3 |
| 6,326,633 B2 | * | 12/2001 | Nakasuji .................. 250/492.3 |

* cited by examiner

Primary Examiner—John R. Lee
Assistant Examiner—David A. Vanore
(74) Attorney, Agent, or Firm—Klarquist Sparkman LLP

(57) ABSTRACT

Electron-beam sources are disclosed that are especially suitable for use in electron-beam microlithography apparatus and methods for transferring a fine pattern from a reticle to a substrate (e.g., semiconductor wafer). The source includes a cathode body with a central conical projection extending toward an anode. The cathode body includes an annular electron-emitting surface. The electron-emitting surface can be defined by coating the cathode body with a material having a higher work function (desirably higher by 1 eV or greater) than the material of the cathode body. The operating temperature of the cathode body is controlled so that electrons are emitted only from the electron-emitting surface.

15 Claims, 2 Drawing Sheets

ELECTRON-BEAM SOURCES AND ELECTRON-BEAM MICROLITHOGRAPHY APPARATUS COMPRISING SAME

FIELD OF THE INVENTION

This invention pertains to electron-beam microlithography (projection-transfer of a pattern, defined by a reticle or mask, to a substrate) using an electron beam. Microlithography is a key technology used in the manufacture of semiconductor integrated circuits, displays, and the like. More specifically, the invention pertains to electron-beam sources that emit an electron beam, and to electron-beam microlithography apparatus comprising such an electron gun.

BACKGROUND OF THE INVENTION

Most conventional electron guns employed in conventional electron-beam microlithography apparatus, and in electron-optical systems utilized in such apparatus, have simple construction and operate under temperature-limiting conditions. The cathode (electron-emitting surface) of a conventional electron gun typically is circular. Consequently, the transverse sectional profile of the beam produced by the electron gun is circular, and the current density of the beam tends to be relatively high in locations in which such high beam-current density causes problems, as summarized below.

Semiconductor-device patterns progressively have become finer in recent years. Currently, considerable demand exists to develop practical technologies for transferring a pattern having linewidths of 0.1 µm or less onto a semiconductor wafer. Whenever a conventional electron-beam microlithography apparatus is used in an attempt to meet these demands, image blur (defocusing) and distortion due to space-charge effects become problematic. The space-charge effects are caused largely by the particular transverse profile and localized high beam-current density of the electron beam in conventional electron-beam microlithography apparatus being "pushed" to achieve such performance.

Reducing image blur and defocusing due to space-charge effects can be achieved by reducing the beam-current density of the electron beam. However, reducing the beam-current density causes other problems such as increased time to expose each wafer, resulting in reduced throughput.

A conventional electron gun used under temperature-limiting conditions also exhibits large variances in current from one exposure ("shot") to the next. This "shot noise" is a key cause of poor linewidth accuracy in transferring a pattern having small linewidths using conventional electron-beam microlithography technology.

SUMMARY OF THE INVENTION

In view of the shortcomings of conventional apparatus and methods as summarized above, an object of the invention is to provide, inter alia, electron-beam sources that are well-suited for use in electron-beam microlithography apparatus intended for use in transferring patterns having linewidths of 0.1 µm or less. Another object is to provide electron-beam microlithography apparatus comprising these electron-beam sources, as well as methods (for manufacturing semiconductor devices) utilizing such apparatus.

According to a first aspect of the invention, electron-beam sources are provided. An embodiment of such a source comprises an electron gun comprising a cathode including an annular electron-emitting surface and at least one anode. The source also includes a controller to which the electron gun is connected. The controller is configured to energize the electron-emitting surface in a controllable manner and to energize the anode in a manner in which the electron gun operates under a space-charge-limiting condition. The cathode comprises a cathode body having a work function, and the annular electron-emitting surface is situated on a surface of the cathode body.

In one configuration, the surface of the cathode body is coated, in regions other than the annular electron-emitting surface, with a material having a work function that is greater than the work function of the cathode body. In this configuration, the work functions of the cathode body and of the material desirably differ from each other by at least 1 eV. For example, the cathode body is made of rhenium and the coating material is tungsten.

In another configuration, the annular electron-emitting surface comprises a coating of a material on the surface of the cathode body, wherein the material has a work function that is less than the work function of the cathode body. In this configuration, the work functions of the cathode body and of the material differ from each other by at least 1 eV. For example, the cathode body is made of tungsten and the coating material is rhenium.

In a desirable configuration of the electron-beam source, the cathode comprises a cathode body that includes a convex projection extending toward the anode. The projection desirably is symmetrical about an optical axis and is situated inside the electron-emitting surface.

The electron-beam source further can comprise a control anode situated between the anode and the cathode. The control anode desirably is energized in a controllable manner so as to control a beam current of an electron beam produced by the electron gun.

According to another aspect of the invention, electron-beam microlithography apparatus are provided. An embodiment of such an apparatus comprises an illumination-optical system, a projection-optical system, and an electron-beam source as summarized above. The electron-beam source is situated and configured to produce an electron beam that passes through the illumination-optical system and the projection-optical system.

In a desirable configuration of the apparatus, the projection-optical system comprises a contrast aperture. The illumination-optical system is configured to produce a first beam crossover and a region of the electron beam having a flat distribution of beam-current density, wherein the region is situated in the vicinity of the first beam crossover. The illumination-optical system is further configured to form an image of the region, having a flat distribution of beam-current density, on a reticle situated between the illumination-optical system and the projection-optical system. The projection-optical system is configured to form an image of the cathode at the contrast aperture.

Other aspects of the invention are directed to methods for manufacturing a semiconductor device on a wafer. The methods include a wafer-processing step that includes electron-beam microlithography of a pattern, defined on a reticle, to a wafer using an electron-beam microlithography apparatus as summarized above.

The foregoing and additional features and advantages of the invention will be more readily apparent from the following detailed description, which proceeds with reference to the accompanying drawings.

DETAILED DESCRIPTION

General Considerations

In general, an electron gun according to the invention operates under space-charge-limiting conditions, and includes an annular electron-emitting surface.

The mean square ($i^2$) of the shot noise of an electron beam emitted from an electron gun operating under temperature-limiting conditions is expressed as:

$$i^2 = 2eI\Delta f \qquad (1)$$

wherein e is the charge of an electron, I is the beam current, and $\Delta f$ is the frequency bandwidth of the noise.

The mean square $i^2$ of the shot noise of an electron beam emitted from an electron gun operating under space-charge-limiting conditions is expressed as:

$$i^2 = 2e\Gamma^2 I \Delta f \qquad (2)$$

In other words, $i^2$ of an electron gun operated under space-charge-limiting conditions is $\Gamma^2$ times $i^2$ of an electron gun operated under temperature-limiting conditions. In Equation (2), $\Gamma^2$ is a function of the cathode temperature. $\Gamma^2$ approaches 1.0 under conditions near temperature-limiting conditions; with further increases in temperature, $\Gamma^2$ drops to about 0.016.

Hence, by operating the electron gun under space-charge-limiting conditions, shot noise is reduced substantially. When such a gun is used in an electron-beam microlithography apparatus, a variation in dose that otherwise would accompany shot noise is reduced correspondingly, allowing accurate transfer of patterns having smaller linewidths. In addition, since the electron-emitting surface of an electron gun according to the invention is annular in shape, the transverse section of an electron beam produced by an electron gun according to the invention is ring-shaped (i.e., the beam is "hollow"). The resulting hollow beam exhibits substantially reduced space-charge effects, which correspondingly reduces image blur and distortion.

First Representative Embodiment

Figure 1:
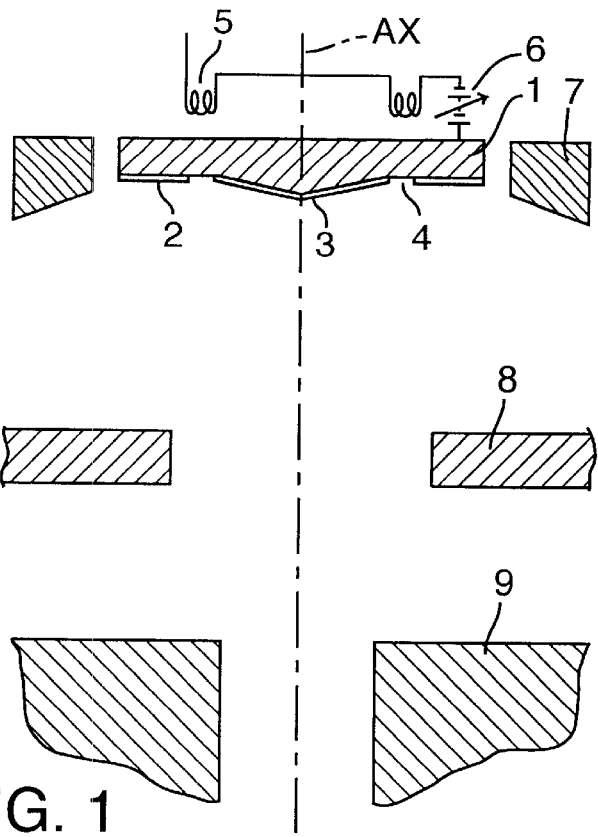
FIG. 1 is an elevational section showing certain components of an electron gun according to a first representative embodiment of the invention.

An electron gun according to this embodiment is shown in FIG. 1. The FIG. 1 embodiment comprises, along an axis AX, a cathode body 1, a ring-shaped coating member 2, a conical coating member 3, an electron-emitting surface 4, a filament 5, a DC filament power supply 6, a Wehnelt electrode 7, a control anode 8, and an anode 9. In this embodiment, the cathode body 1 desirably is made from a round plate of rhenium having a center region that conically protrudes toward the anode 9. The cathode body 1 is surfaced with the coating member 2 (deposited around the perimeter of the surface of the cathode body 1) and the conical coating member 3 (deposited on the conical projection at the center of the surface of the cathode body 1). An annular gap is situated between the coating members 2, 3, in which gap the material of the cathode body 1 is exposed to form an electron-emitting surface 4.

In this embodiment, the coating members 2, 3 desirably are made of tungsten, which has a higher work function than rhenium. Desirably, the difference in work function between the material of the cathode body 1 and the material of the coating members 2, 3 is 1 eV or greater.

The cathode body 1 is heated from behind by a filament 5. The filament 5 is situated behind the electron-emitting surface 4, and is connected to the DC filament power supply 6. The power supply 6 heats the filament 5 and thus energizes the electron-emitting surface 4 sufficiently to cause the electron-emitting surface 4 to produce a beam of electrons propagating downstream of the electron-emitting surface 4. In other words, the cathode body 1 is heated by electrons emitted from the filament 5. The emitted electrons are accelerated by the power supply 6 toward the cathode body 1 and collide with the cathode body 1. Energization of the cathode body 1 is controlled such that electrons are emitted from the electron-emitting surface 4 but not from the coating members 2, 3.

The Wehnelt electrode 7 is in surrounding relationship to the cathode body 1. The Wehnelt electrode 7 is charged so as to prevent the electron beam, urged from the cathode by a negative voltage impressed on the cathode body 1, from spreading outward from the axis AX. Since the action of a Wehnelt electrode 7 is well known, further explanation of it is omitted.

Electrons emitted from the electron-emitting surface 4 are accelerated by a voltage impressed on the anode 9. However, since the FIG. 1 electron gun is operated under space-charge-limiting conditions (in which the cathode energization is controlled so that electrons are emitted only from the electron-emitting surface 4), the beam current at the anode 9 cannot be controlled by controlling the cathode temperature. Hence, a control anode 8 is provided to control the beam current at the anode. Such control is achieved by controlling the voltage impressed on the control anode 8.

The center of the cathode body 1 is conical (protruding toward the anode 9) so that the electrons emitted from the electron-emitting surface 4 do not propagate inward toward the axis AX. Hence, the electron beam produced by the FIG. 1 gun has an annular transverse profile characteristic of a "hollow" beam.

By coating the cathode surface in regions (other than the annular portion comprising the electron-emitting surface 4) with a material having a work function greater than the work function of the cathode material, and by controlling the cathode temperature so as to generate an energy condition in the electron-emitting surface 4 that is greater than the work function of the cathode material but less than the work function of the coating material, electrons are emitted only from the annular electron-emitting surface 4. This configuration provides an electron gun in which both space-charge effects and shot noise are reduced substantially compared to conventional electron guns.

Second Representative Embodiment

Figure 2:
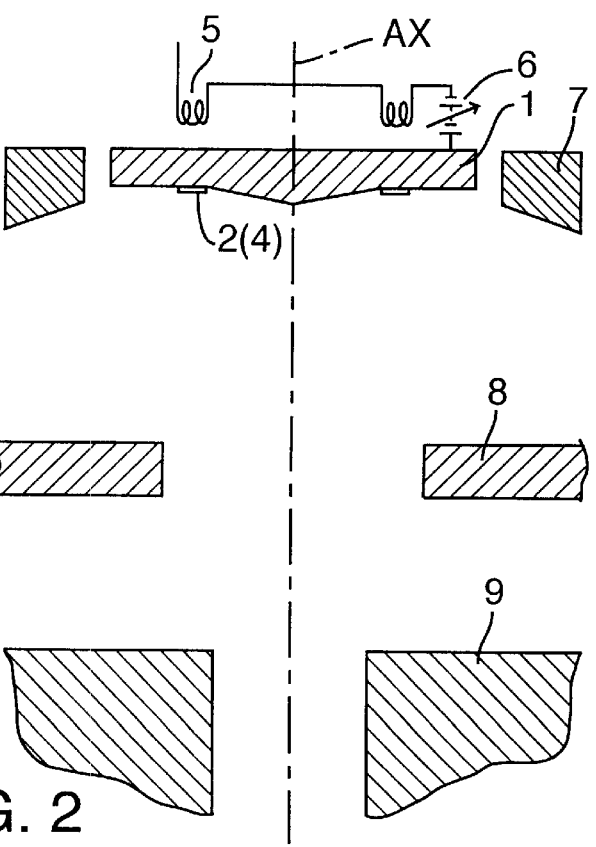
FIG. 2 is an elevational section showing certain components of an electron gun according to a second representative embodiment of the invention.

This embodiment is depicted in FIG. 2, in which components that are the same as corresponding components in the FIG. 1 embodiment have the same reference designators and are not described further. The FIG. 2 embodiment differs from the FIG. 1 embodiment only in terms of cathode structure. Hence, only this difference is discussed below.

In this embodiment, the cathode body 1 desirably is constructed of tungsten configured as a round plate with a conical center region protruding toward the anode 9. A ring-shaped (annular) coating member 2, desirably made of rhenium (having a lower work function than tungsten) is deposited adjacent the conical portion. As in the FIG. 1 embodiment, energization of the cathode body 1 is controlled so that electrons are emitted from the annular member 2 but not from the cathode body 1. In such a configuration, the annular member 2 is the electron-emitting surface 4, which produces an electron beam having an annular transverse profile (i.e., a "hollow" beam).

In this embodiment, electrons are emitted only from the annular member 2 if the cathode temperature is controlled so as to generate an energy condition that is less than the work function of the material of the cathode body 1 but greater than the work function of the material of the annular member 2. Hence, this embodiment provides an electron gun in which both space-charge effects and shot noise are reduced substantially compared to conventional electron guns. Desirably, the difference between the work functions of the material of the cathode body 1 and the material of the annular member 2 is 1 eV or greater.

Conventionally, tantalum is used as an electron-emitting surface. But, there is no known material that can withstand high temperatures and that has a work function sufficiently higher than that of tantalum to serve as the cathode body 1 in this embodiment. By using rhenium as the electron-emitting surface 4 in this embodiment, tungsten (having a work function that is at least 1 eV higher than rhenium) can be used as the cathode body 1. This configuration also withstands high operating temperatures.

Third Representative Embodiment

Figure 3:
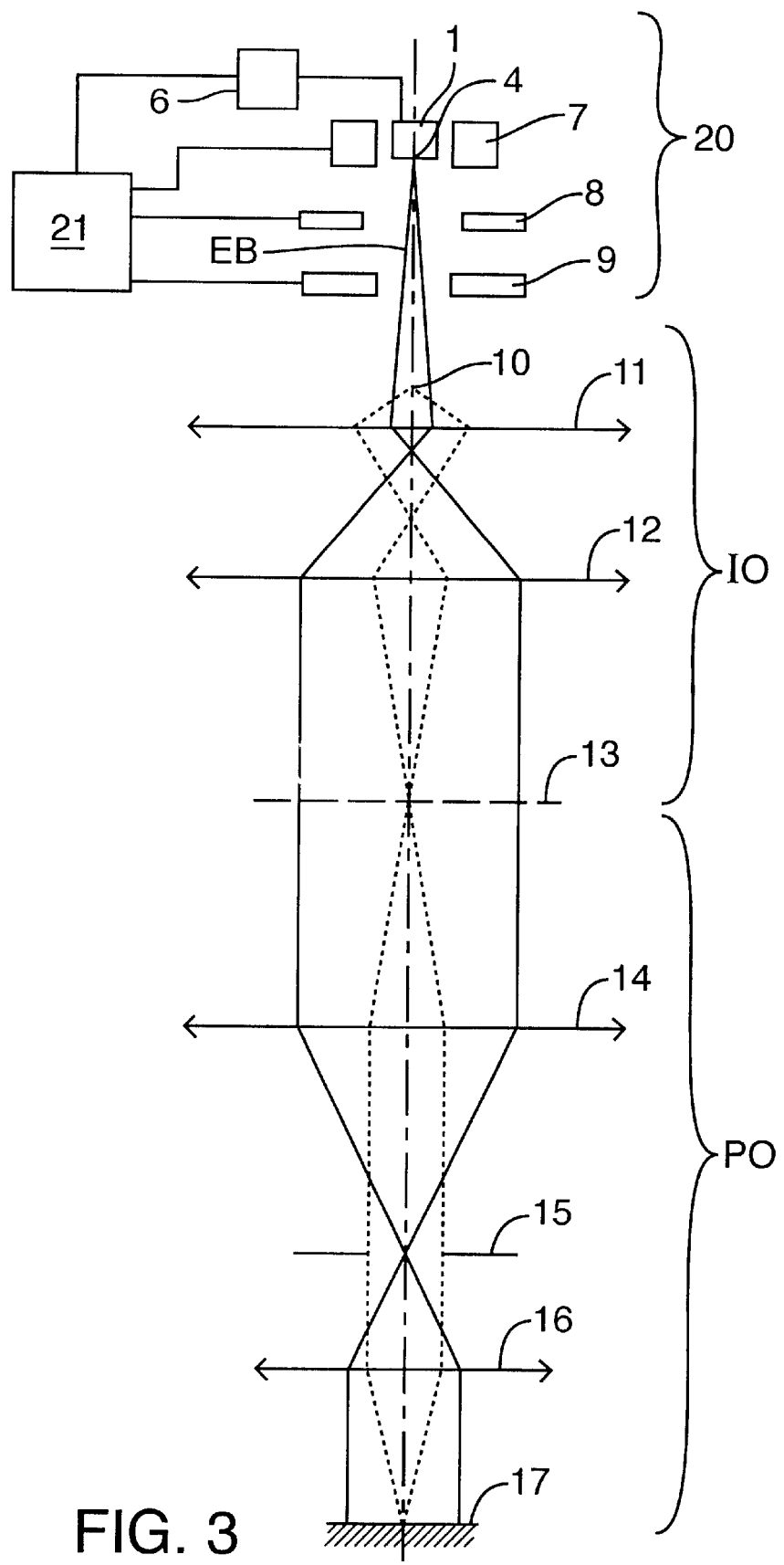
FIG. 3 is a schematic optical diagram of a representative embodiment of an electron-beam microlithography apparatus according to the invention.

An electron-beam microlithography apparatus according to this embodiment is depicted schematically in FIG. 3. The FIG. 3 apparatus includes an electron gun 20 according to the invention, comprising a cathode body 1, an electron-emitting surface 4, a Wehnelt electrode 7, a control anode 8, and an anode 9. The electron-emitting surface is energized by a filament (not shown but see FIGS. 1 and 2) connected to a power supply 6. To ensure consistent operation under space-charge-limiting conditions, the electron gun 20 is connected to a controller 21.

The electron beam EB produced by the electron gun 20 has a flat current-density distribution in the region 10. Items 11 and 12 are condenser lenses and item 13 is a reticle (or mask). The FIG. 3 apparatus also includes first and second projection lenses 14, 16, respectively, and a contrast aperture 15. Item 17 is a substrate (e.g., semiconductor wafer).

The portion of the system between the electron gun 20 and the reticle 13 is termed the "illumination-optical system" IO. The illumination-optical system IO directs the electron beam (termed an "illumination beam") from the electron gun 20 to illuminate a desired region of the reticle 13.

The portion of the system between the reticle 13 and the substrate 17 is termed the "projection-optical system" PO. The projection-optical system PO directs the electron beam downstream of the reticle 13 (termed the "patterned beam") from the reticle 13 to the substrate 17 in a manner suitable for forming an image on the substrate of the illuminated region of the reticle.

The electron beam EB emitted from the electron-emitting surface 4 is accelerated by the anode 9 into the illumination-optical system IO. As noted above, the illumination-optical system IO directs the illumination beam to a desired region of the reticle 13. For illuminating the desired region of the reticle, the illumination beam is shaped appropriately by passage through the condenser lenses 11, 12. The portion of the illumination beam that has passed through the illuminated region of the reticle 13 forms an image of the illuminated region on the surface of the substrate 17. Such "projection" of the patterned beam is achieved mainly by the first and second projection lenses 14, 16 of the projection-optical system PO. The contrast aperture 15 serves to limit the aperture angle of the patterned beam incident to the substrate 17.

In a conventional illumination-optical system, an image of the electron-emitting surface of the electron gun is formed on the reticle. However, in the FIG. 3 embodiment, the image formed on the reticle 13 is an image of the region 10 of the illumination beam having a flat distribution of beam-current density (the region 10 is formed in the vicinity of a first crossover of the electron beam EB). i.e., by employing an electron gun, according to the invention, in which the electron-emitting surface is annular, a field is generated in the vicinity of the first crossover in which the distribution of beam-current density is flat. Hence, the reticle surface can be illuminated uniformly by forming an image of the field on the reticle surface. (The term "in the vicinity" reflects the fact that the flat distribution of beam-current density need not be located exactly at the first crossover. Actually, the flat distribution of beam-current density extends somewhat upstream and downstream of the first crossover, as will be understood by persons of ordinary skill in the relevant art.)

Whenever, according to conventional practice, an image of the electron-emitting surface is formed on the reticle, the resulting illuminated region of the reticle is ring shaped, and uniform illumination of the reticle is not achieved. In the FIG. 3 embodiment, it is desirable that the region 10 (in which the distribution of beam-current density is flat) be located at the front-focal position of the illumination-optical system IO and that the reticle 13 be located at the rear-focal position of the illumination-optical system IO. In such a configuration, the illumination-optical system IO is telecentric.

The FIG. 3 embodiment is configured such that an image of the electron-emitting surface 4 also is formed at the contrast aperture 15. Since the patterned beam is focused at the position of the contrast aperture 15, conventional wisdom would lead to the expectation that space-charge effects be substantial at that location. However, according to the invention, by making the transverse-sectional profile of the electron beam hollow, an image of the electron-emitting surface 4 is formed in the region of the contrast aperture 15, but space-charge effects are reduced substantially. In addition, since the beam in the area of the contrast aperture 15 exhibits substantially reduced space-charge effects, the resulting electron-beam microlithography apparatus can be configured to produce a higher beam current without adverse effects.

By reducing both shot noise and space-charge effects according to the invention, image blur and distortion that otherwise would be caused by these phenomena are decreased. This allows patterns having fine linewidths to be transferred microlithographically with high accuracy.

Whereas the invention has been described above in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electron-beam source, comprising:
   an electron gun comprising a cathode including an annular electron-emitting surface and at least one anode;
   a controller to which the electron gun is connected, the controller being configured to energize the electron-emitting surface and the anode in a manner in which the electron gun operates under a space-charge-limiting condition.

2. The electron-beam source of claim 1, wherein:
   the cathode comprises a cathode body having a work function, the annular electron-emitting surface being situated on a surface of the cathode body; and
   the surface of the cathode body is coated, in regions other than the annular electron-emitting surface, with a material having a work function that is greater than the work function of the cathode body.

3. The electron-beam source of claim 2, wherein the respective work functions of the cathode body and of the coating material differ from each other by at least 1 eV.

4. The electron-beam source of claim 2, wherein the cathode body is made of rhenium and the coating material is tungsten.

5. The electron-beam source of claim 1, wherein:

the cathode comprises a cathode body having a work function, the annular electron-emitting surface being situated on a surface of the cathode body; and the annular electron-emitting surface comprises a coating of a material on the surface of the cathode body, the material having a work function that is less than the work function of the cathode body.

6. The electron-beam source of claim 5, wherein the respective work functions of the cathode body and of the coating material differ from each other by at least 1 eV.

7. The electron-beam source of claim 5, wherein the cathode body is made of tungsten and the coating material is rhenium.

8. The electron-beam source of claim 1, wherein:

the cathode comprises a cathode body;

the cathode body comprises a convex projection extending toward the anode, the projection being symmetrical about an optical axis and being situated inside the electron-emitting surface.

9. The electron-beam source of claim 8, further comprising a Wehnelt electrode situated radially outside the cathode body.

10. The electron-beam source of claim 1, further comprising a control anode situated between the anode and the cathode, the control anode being controlled energized by the controller so as to control a beam current of an electron beam produced by the electron gun.

11. An electron-optical system, comprising an electron-beam source as recited in claim 1.

12. An electron-beam microlithography apparatus, comprising an illumination-optical system, a projection-optical system, and an electron-beam source as recited in claim 1, the electron-beam source being situated and configured to produce an electron beam that passes through the illumination-optical system and the projection-optical system.

13. The apparatus of claim 12, wherein:

the projection-optical system comprises a contrast aperture;

the illumination-optical system produces a first beam crossover and a region of the electron beam having a flat distribution of beam-current density, the region being situated in the vicinity of the first beam crossover;

the illumination-optical system also forms an image of the region, having a flat distribution of beam-current density, on a reticle situated between the illumination-optical system and the projection-optical system; and the projection-optical system forms an image of the cathode at the contrast aperture.

14. In a method for manufacturing a semiconductor device on a wafer, a wafer-processing step including electron-beam microlithography of a pattern, defined on a reticle, to a wafer using an electron-beam microlithography apparatus as recited in claim 12.

15. In a method for manufacturing a semiconductor device on a wafer, a wafer-processing step including electron-beam microlithography of a pattern, defined on a reticle, to a wafer using an electron-beam microlithography apparatus as recited in claim 13.

* * * * *